United States Patent [19]

Sullivan et al.

[11] Patent Number: 4,859,300

[45] Date of Patent: Aug. 22, 1989

[54] PROCESS FOR TREATING PLASTICS WITH ALKALINE PERMANGANATE SOLUTIONS

[75] Inventors: Thomas E. Sullivan, Hamden; Juan Haydu, Orange, both of Conn.

[73] Assignee: Enthone, Incorporated, West Haven, Conn.

[21] Appl. No.: 296,361

[22] Filed: Jan. 9, 1989

Related U.S. Application Data

[63] Continuation of Ser. No. 72,478, Jul. 13, 1987, abandoned.

[51] Int. Cl.$^4$ .............................................. C25B 11/04
[52] U.S. Cl. .................................... 204/164; 204/292
[58] Field of Search ................................ 204/164, 292

[56] References Cited

U.S. PATENT DOCUMENTS

| | | | |
|---|---|---|---|
| 3,927,177 | 12/1975 | Okabe et al. | 423/235 |
| 4,085,191 | 4/1978 | Mein et al. | 423/208 |
| 4,107,023 | 8/1978 | Mentz | 204/269 |
| 4,427,498 | 1/1984 | Wagner | 204/225 X |

FOREIGN PATENT DOCUMENTS 3716013  11/1988  Fed. Rep. of Germany .

Primary Examiner—Stephen J. Kalafut
Attorney, Agent, or Firm—John J. Tomaszewski; Kenneth A. Koch

[57] ABSTRACT

The permanganate process for treating plastics, e.g., printed circuit boards, to enhance the adhesion of metal plating to the plastic is improved by employing electrolysis to either maintain a certain permanganate level in the operating bath or to regenerate a spent or used bath.

3 Claims, No Drawings

PROCESS FOR TREATING PLASTICS WITH ALKALINE PERMANGANATE SOLUTIONS

This is a continuation of co-pending application Ser. No. 072,478, filed on July 13, 1987, now abandoned.

BACKGROUND OF THE INVENTION

This invention relates to the electroless metal plating of plastics employing an alkaline permanganate solution pretreatment process and, more particularly, to improving the efficiency and operating life of the permanganate step of the metal plating process.

The metal plating of plastic parts is well-known to be of considerable commercial importance. An important metal plating process is the preparation of electronic circuit boards which requires the electroless plating of a conductive metal layer, usually copper, onto the plastic substrate of the board, such as epoxy, and for convenience the following description will relate specifically to this process.

These boards vary in design and may have a copper layer on each surface of the epoxy (two-sided boards) or they can be multi-layer boards which have a plurality of inter-leaved parallel planar copper and epoxy layers. In both type boards through-holes are drilled in the board and metal plated to facilitate connection between the circuits on the copper layers.

The problems in plating either the through-holes or other plastic parts of the board are well-known in the art and a number of methods have been developed to improve the adhesion of the metal plating to the epoxy. These methods generally employ oxidants to etch the surface of the plastic prior to plating and include chromic acid, sulfuric acid and acidic and alkaline permanganate solutions. The toxicity of the chromium compounds and their potential hazards as water pollutants and the safety precautions needed with sulfuric acid have increased the commercial use of permanganate solutions, particularly alkaline permanganate solutions, and a number of patents have been granted in this area such as U.S. Pat. Nos. 3,652,351; 4,042,729; 4,054,693; 4,592,852; and 4,629,636; the disclosures of the patents being incorporated by reference.

The present invention relates to improving the operating life of the permanganate bath since, during use, the permanganate ions are reduced and depleted forming manganate ions and manganese dioxide. To maintain activity the bath must either be regenerated by the addition of permanganate ions or, when the solution becomes spent and cannot be regenerated because of the build-up contaminants, the bath must be replaced. Both procedures are time consuming and are not cost effective and U.S. Pat. Nos. 4,042,729; 4,529,852 and 4,629,636 are specifically addressed to this problem.

U.S. Pat. No. 4,042,729 provides a means for rejuvenating the bath to remove organics and produce permanganate by disproportionation of manganate ions comprising bubbling $CO_2$ into the bath to lower the pH from 12.5 to 11 to 11.5, heating to form permanganate ions and manganese dioxide from the manganate ions, cooling, precipitating carbonates and filtering to remove the manganese dioxide and carbonates. The preparation and control of the compositions and rejuvenating procedures of this patent are unwieldly and time consuming however.

U.S. Pat. Nos. 4,592,852 and 4,629,636, which are owned by the assignee of the present invention, provide a significantly enhanced permanganate treatment process. Basically, the alkaline permanganate etching compositions comprise permanganate ions and a secondary oxidant capable of oxidizing manganate ions to permanganate ions during the treatment process resulting in excellent stability and increased operating life for the bath. The formation of undesirable lower oxidation state manganese products such as manganese dioxide is lowered and, additionally, the activity of the solution is also unexpectedly enhanced and shorter treatment times are generally required than with prior art compositions.

The demands of industry are always increasing however, and there is still a need for improved alkaline permanganate etching solutions and methods for using the solutions to etch plastic substrates.

SUMMARY OF THE INVENTION

It has now been discovered that the permanganate process for treating plastics, e.g., printed circuit boards, may be improved by electrolysis of the solution to either maintain a certain permanganate level in the operating bath or to regenerate a spent or used bath. The preferred process is to electrolyze the bath during the treatment process to, in effect, continually convert any lower oxidation state manganese compounds which are formed e.g., manganate ions, to permanganate ions. This process preferably employs a treatment tank made of a suitable metal which would serve both as the container and as the anode. Any suitable material could be employed as the cathode. The surface area of the anode is preferably appreciably larger than the surface area of the cathode to minimize undesirable reductive effects at the cathode.

DETAILED DESCRIPTION OF THE INVENTION

The alkaline permanganate solutions and methods of employing the solutions are well-known in the art and suitable compositions are shown in the patents noted hereinabove. The compositions are employed at an elevated temperature and is, in general, about 32° C. to the lesser of the boiling point of the solution and the softening point of the plastic. For epoxy boards the temperature is preferably about 60° to 72° C. The effective contact time will vary with the concentration and temperature of the solution and the plastic substrate being treated and in general will not exceed about 30 minutes, preferably 5 to 15 minutes, e.g., 10 minutes. For epoxy boards a contact time of about 8–12 minutes at a temperature of about 62°–69° C. has been found to provide excellent results.

In general and for purposes of illustration, the process of using alkaline permanganate solutions in manufacturing printed circuit boards and, in particular, boards containing through-holes, is a sequence of steps commencing with a commercially available laminate or multi-laminate made from, e.g., paper-epoxy or glass-epoxy material. A typical manufacturing process is described in U.S. Pat. No. 4,629,636.

At the point in the manufacturing process where the printed circuit board is treated with the permanganate solution, the board is typically immersed in a bath of the solution for the time needed to achieve the desired etching effect. Usually the boards are connected to plating racks which hold a multiplicity of the boards and numerous racks may be used simultaneously in the bath.

The bath is preferably contained in a tank made of any suitable conductive anodic material which is generally resistant to the permanganate solution to avoid, e.g., dissolution or corrosion of the tank. Exemplary materials include stainless steel, titanium and alloy steel. Titanium is the preferred material of construction. Alternatively, a nonconductive tank may be employed such as polypropylene, with a conductive material used in the solution as the anode of the electrolysis circuit.

The cathode will likewise be any suitable conductive material and will also be in contact with the permanganate solution to form the electrolysis circuit. Suitable materials include steel, stainless steel and titanium with stainless steel being preferred for cost reasons.

It is highly preferred that the anode and cathode be in contact with the bath used to etch the printed circuit boards but it is within the scope of the invention that other suitable methods of electrolyzing the permanganate solution may be employed. For example, the solution may be intermittently or continually purged from the tank and treated in a separate electrolysis cell and returned to the tank. Make-up permanganate solution may be needed during the treatment process and the solution may be added as required as is well known in the art. Likewise, any solids formed during use of the bath, e.g., manganese dioxide, may be separated from the solution as desired.

A preferred process also employs agitation in the tank to prevent depletion of ions at the electrodes, particularly manganate ions at the anode, and any form of mixing may be used. An effective means is to employ air agitation in the tank. Additionally, the surface area of the anode is preferably significantly larger than the cathode surface area to minimize undesirable reductive effects at the cathode. In general, an anode to cathode surface area ratio may be greater than 100:1 or higher and is preferably about 30:1 to 3:1. The preferred mode as discussed above is to construct the tank from a material suitable for use as the anode.

The operating temperature for the bath may vary widely and is typically the same as the temperature used to treat the boards with the permanganate solution, e.g., about 40° C. to 80° C., and usually 60° to 75° C. Lower temperatures may be used when boards are not being treated to achieve enhanced regeneration effects by minimizing side reactions such as disproportionation. For example, if it is desired to regenerate the bath during a time period when the bath is not being used, e.g., overnight, any suitable temperature may be employed. Generally, the operating temperature for this type situation is about 20°-60° C.

Cell voltage may also vary widely and is generally between about 1 to 20 volts. A preferred range is 2 to 5 volts. Anode current densities are about 50 to 1500 amps/meter$^2$ (A/m$^2$) or higher and, preferably about 150 to 700 A/m$^2$. Cathode current densities are about 500 to 10,000 A/m$^2$ or higher and preferably about 2000 to 7000 A/m$^2$.

Operation of the electrolysis process will depend on the concentration of permanganate ions in the bath relative to the concentration of lower oxidation state manganese ions such as manganate ions and compounds such as manganese dioxide. The preferred process is to continually electrolyze the solution while treating plastics whereby reduced permanganate ions will be continually oxidized to permanganate ions with, consequently, minor amounts of lower oxidation state ions being present in the solution.

Numerous textbooks and articles describe the electrolysis process and it is contemplated herein that any such process (including varying parameters such as current density, temperature, etc.) may be suitably employed without departing from the scope of the invention. One such publication, which is hereby incorporated by reference, is The Encyclopedia of Chemical Technology, Kirk-Othmer, Third Edition, Volume 14, pages 871–877.

The following examples are given for purposes of illustration only and are not to be considered as constituting a limitation on the present invention. All parts and percentages given are by weight and temperatures in degrees centigrade unless otherwise indicated.

EXAMPLE

Potassium manganate, $K_2MnO_4$, 6 grams, was added to 150 ml. of 1.5 molar sodium hydroxide solution.. The mixture was warmed to 35° C. for 15 minutes to promote dissolution of the salt. The green solution was suction filtered and 0.11 gram brown water-insoluble material (presumably $MnO_2$) was collected. The dark green filtrate exhibited no purple color indicative of permanganate ion.

The filtered solution described above was placed in a 250 ml. stainless steel beaker which serves as the cell anode (129 cm$^2$ anode area). A stainless steel strip attached to a clip (12 cm$^2$ cathode area) was inserted in the solution and functioned as the cathode. The solution was circulated with a magnetic stir bar while undergoing electrolysis at 4 amps and 4 volts for 30 minutes. The voltage dropped to 3.24 as the temperature rose from ambient to 43° C. The electrolyzed solution was noticably purple. An iodometric titration showed 0.93 meq/ml oxidative strength (compared with 0.74 meq/ml before electrolysis). The solution was further electrolyzed at 4 amps for 50 minutes. Spectrophotometric analysis gave a value of 28.6 g/l $KMmO_4$. This represents a 97% potassium permanganate yield based on the reaction:

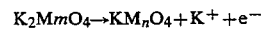

$$K_2MmO_4 \rightarrow KM_nO_4 + K^+ + e^-$$

The electrolyzed solution was combined with 5.50 grams $K_2MnO_4$, warmed, stirred and suction filtered. The purple-green filtrate was subjected to electrolysis as previously described for 45 minutes. Iodometric analysis showed 56.2 grams per liter $KMnO_4$ present in the electrolyzed solution; colorimetric analysis was 54.2 grams per liter. An 82% conversion was calculated for this 45 minute process. Further electrolysis for 20 minutes yielded no increase in permanganate concentation. The solution was suction filtered through glass fiber media. Eleven milligrams of brown insoluble material was collected ($MnO_2$) demonstrating that electrolysis and not a disproportionation reaction occurred. The disproportionation reaction,

$$3K_2MnO_4 + 2H_2O \rightarrow 2KMnO_4 + MnO_2 + 4KOH$$

would generate 1.7 grams $MnO_2$ based on the total available $K_2MnO_4$.

It will be apparent that many changes and modifications of the several features described herein may be made without departing from the spirit and scope of the invention. It is therefore apparent that the foregoing description is by way of illustration of the invention rather than limitation of the invention.

We claim:

1. In a process for treating plastic articles to increase the adhesion of metal plating to the articles wherein the articles are immersed in an operating permanganate solution bath to etch the articles and then removed from the bath with the procedure being repeated for new articles until the solution is spend and/or in need of regeneration by adding fresh permanganate solution, the improvement comprising:

utilizing an anode electrode and cathode electrode in contact with the operating permanganate solution bath and passing current through the electrodes to effect a net oxidation of the operating bath during the treatment process.

2. The process of claim 1 wherein the anode is titanium and has a larger surface area than the cathode electrode.

3. The process of claim 2 wherein the solution is contained in a tank made of titanium and the titanium serves as the anode.

* * * * *